(12) United States Patent
Sakayori

(10) Patent No.: US 7,994,771 B2
(45) Date of Patent: Aug. 9, 2011

(54) CURRENT MEASUREMENT CIRCUIT, CURRENT DETECTION CIRCUIT AND SATURATION PREVENTION AND RECOVERY CIRCUIT FOR OPERATIONAL AMPLIFIER

(75) Inventor: Hiroshi Sakayori, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 297 days.

(21) Appl. No.: 12/423,219

(22) Filed: Apr. 14, 2009

(65) Prior Publication Data

US 2010/0085034 A1    Apr. 8, 2010

Related U.S. Application Data

(60) Provisional application No. 61/103,570, filed on Oct. 8, 2008.

(51) Int. Cl.
*G01R 19/00*    (2006.01)

(52) U.S. Cl. ..................................... 324/76.11; 324/522

(58) Field of Classification Search ............... 324/76.11, 324/522, 713; 702/1, 57, 64; 361/30, 31, 361/33, 78, 79, 86, 87
See application file for complete search history.

(56) References Cited

U.S. PATENT DOCUMENTS

| | | | | |
|---|---|---|---|---|
| 4,402,030 | A | * | 8/1983 | Moser et al. ................. 361/94 |
| 5,371,469 | A | * | 12/1994 | Anderson ................. 324/705 |
| 5,886,581 | A | * | 3/1999 | Hugel et al. ................. 330/308 |
| 6,465,933 | B1 | * | 10/2002 | North, Jr. ................. 310/317 |
| 2009/0084677 | A1 | * | 4/2009 | Kawase et al. ................. 204/402 |

FOREIGN PATENT DOCUMENTS

JP    63-082377 A1    4/1988

* cited by examiner

*Primary Examiner* — Hoai-An D Nguyen

(57) ABSTRACT

A current measurement circuit includes: a constant-voltage loop circuit including an operational amplifier, and a first resistor for current detection connected to an output of the operational amplifier, the output of the operational amplifier being fed back to an inverting input terminal of the operational amplifier via the first resistor; a differential amplifier for current detection with an input of a voltage between both ends of the first resistor; and a saturation prevention and recovery circuit connected to the both ends of the first resistor for preventing saturation of the operational amplifier and/or accelerating recovery from the saturation thereof.

10 Claims, 7 Drawing Sheets

CURRENT MEASUREMENT CIRCUIT, CURRENT DETECTION CIRCUIT AND SATURATION PREVENTION AND RECOVERY CIRCUIT FOR OPERATIONAL AMPLIFIER

BACKGROUND OF THE INVENTION

Conventionally, as a current measurement circuit in a constant voltage circuit, basically, a current measurement circuit 200 as illustrated in FIG. 4 has been used. In other words, an output of an operational amplifier 202 is connected for feedback to an inverting input terminal of the operational amplifier 202, thereby constructing a constant-voltage loop circuit and applying an output voltage, which is equal to a set voltage applied to an input terminal 212, on an output terminal 214. The feedback is applied to the output terminal 214 of the operational amplifier 202 so that the output voltage is a constant voltage equal to the set voltage applied to the input terminal 212, and is output to the output terminal 214. A current which flows through a device under test DUT (208) via a current detection resistor Rr (204), which is connected between the output of the operational amplifier 202 and the output terminal 214 and has a known resistance, can be measured by measuring a voltage between both ends of the current measurement resistor 204 at a current measurement terminal 216 via a differential amplifier 210.

In general, when an operational amplifier is driven to be saturated, it takes long time until the operational amplifier recovers. According to the method illustrated in FIG. 4, when a low current is to be measured, it is necessary for the current detection resistor 204 to have a large resistance. In this case, when the current flowing through the resistor only slightly increases, the voltage applied to the resistor increases largely.

Further, in this circuit, there exist parasitic capacitors due to considerable sizes of the current detection resistor 204 and peripheral circuits thereof. As a result of the influence thereof, when the set voltage largely changes, a large transient current flows, whereby the operational amplifier 202 in the constant-voltage loop tends to be saturated, and consequently, the measurement cannot be performed in this case. Moreover, when a low current is to be measured, the current detection resistor having a large resistance is inserted, and hence the load current cannot be large. Accordingly, there poses a problem that it takes a long period of time until the load current reaches and stabilizes at a steady-state value, and the operational amplifier recovers from the saturation, and returns to the state for correct measurement.

FIG. 1 of Japanese Patent Application Laid-open No. Sho 63-82377 discloses a circuit for solving this problem. For the sake of description, the related figure is herein illustrated as FIG. 5. In FIG. 5, reference numeral 10 denotes a load for which a current is measured, and a constant-voltage loop circuit 12 applies a load voltage $V_1$ for measuring the current. In the configuration of the constant-voltage loop circuit 12, a DC voltage $V_2$, which is specified by a digital signal 18 from a digital/analog converter 16 so as to be converted to an analog signal, is applied to an inverting input terminal of an operational amplifier 14 via a resistor 20, and the load voltage $V_1$ is fed back via a voltage follower constructed by an operational amplifier 22, and a resistor 24. A non-inverting input terminal of the operational amplifier 14 is grounded. An output of the operational amplifier 14 is connected to an input of a current booster (buffer amplifier) 26, and an output thereof is connected to a load connection terminal 28.

The gain of this constant-voltage loop circuit 12 is determined by values of the resistors 20 and 24, and the load voltage $V_1$ is maintained to a constant value proportional to the DC voltage $V_2$.

In a current path serial to the load 10 in the constant-voltage loop circuit 12, in other words, between the output of the current booster 26 and the load connection terminal 28, a current detection resistor $R_1$ is inserted, and current detection resistors $R_2$ to $R_n$ for changing the range are provided so as to be selectively inserted in parallel by respective reed relays $RY_1$ to $RY_m$. On this occasion, the resistor $R_1$ is a current detection resistor for the minimum range, and a reed relay $RY_n$ is provided in parallel with the resistors $R_1$ to $R_n$ so as to short-circuit the current measurement resistors $R_1$ to $R_n$.

A relay control circuit 30 controls, according to a digital control signal 32, the reed relays $RY_1$ to $RY_n$.

An operational amplifier 34 is provided for detecting a voltage drop of the current detection resistors $R_1$ to $R_n$, the output voltage of the current booster 26 is applied to a non-inverting input thereof, the load voltage $V_1$ is applied to an inverting input thereof via a voltage follower constructed by an operational amplifier 36, and an output voltage $V_3$ of the operational amplifier 34 is a voltage proportional to the load current.

When the load 10 is capacitive, and a predetermined voltage is applied to the load 10, the reed relay control circuit 30 connects resistors $R_2$ to $R_n$ according to a measurement range to the resistor $R_1$ in parallel, and at the same time, the reed relay for short circuit $RY_n$ is closed.

As a result, even for a small current measurement range, a transient current of the load 10 is not limited, and the load current is stabilized to a steady-state value in a short time. Moreover, the load current is not limited, and hence the operational amplifier 14 and the current booster 26 in the constant-voltage loop circuit 12 will not be saturated.

In this way, when the period of time required for the load current reaching the steady-state value has elapsed from the application of voltage, the relay control circuit 30 opens the reed relay for short circuit $RY_n$, whereby a voltage proportional to the load current is measured as the output voltage $V_3$ of the operational amplifier 34.

However, an operation speed of the reed relays is low in the constant-voltage loop circuit 12 illustrated in FIG. 5, and thus, it is impossible to efficiently avoid in advance the saturation of the operational amplifier, and to efficiently reduce the recovery time from the saturation of the operational amplifier. This is because it takes at least 250 microseconds for each operation of opening or closing the reed relays. Further, it takes a time to convert the output voltage $V_3$ of the operational amplifier 34 into the digital control signal 32 for the drive control of the relay control circuit 30.

SUMMARY

It is therefore an object of this invention to provide a saturation prevention and/or saturation recovery circuit for an amplifier for solving the above-mentioned problems, which is capable of carrying out state detection operation and control operation at high speed, a current detection circuit provided therewith, or a current measurement circuit provided therewith.

It is another object of this invention to provide a saturation prevention and/or saturation recovery circuit for an amplifier having a self-detection function and/or self-control function, a current detection circuit provided therewith, or a current measurement circuit provided therewith.

A current measurement circuit according to this invention includes: a constant-voltage loop circuit including an operational amplifier, and a current detection resistor connected to an output of the operational amplifier, the output of the operational amplifier being fed back to an inverting input terminal of the operational amplifier via the current detection resistor; a differential amplifier for current detection with an input of a voltage between both ends of the current detection resistor; and a saturation prevention and recovery circuit connected to the both ends of the current detection resistor for preventing saturation of the operational amplifier and/or accelerating recovery from the saturation thereof.

Further, the current measurement circuit according to this invention includes an aspect in which the saturation prevention and recovery circuit includes: first and second connection terminals connected to the both ends of the current detection resistor; a first shunt circuit including a first resistor and a first diode, which are serially connected, the first shunt circuit being connected between the first and second connection terminals in parallel with the current detection resistor; a second shunt circuit including a second resistor and a second diode, which are serially connected, the second shunt circuit being connected between the first and second connection terminals in parallel with the current detection resistor and the polarity of the second diode being connected oppositely to that of the first diode; a first bias circuit connected to a connection point between the first resistor and the first diode, in a steady state, reversely biasing the first diode; and a second bias circuit connected to a connection point between the second resistor and the second diode, in a steady state, reversely biasing the second diode.

Further, the current measurement circuit according to this invention includes an aspect in which one of the first and second diodes, when the voltage applied to the both ends of the current detection resistor increases above or decreases below a predetermined voltage, turns on to connect one of the first and second resistors, which is connected to the diode, to the current detection resistor in parallel with each other, thereby preventing the saturation of the operational amplifier and/or accelerating the recovery from the saturation thereof.

Further, a current detection circuit according to this invention includes: a current detection resistor provided a first and a second connection terminals; the first connection terminal of the current detection resistor being connected to an output of an operational amplifier; first and second resistors connected in parallel with each other to the first connection terminal of the current detection resistor; a first diode including a cathode connected to another end of the first resistor which is not connected to the first connection terminal of the current detection resistor, and an anode connected to the second connection terminal of the current detection resistor; a second diode including an anode connected to another end of the second resistor which is not connected to the first connection terminal of the current detection resistor, and a cathode connected to the second connection terminal of the current detection resistor; a first voltage supplying terminal; a second voltage supplying terminal; a third resistor connected between the cathode of the first diode and the first voltage supplying terminal; and a fourth resistor connected between the anode of the second diode and the second voltage supplying terminal.

Further, a current detection circuit according to this invention includes an aspect in which one of the first and second diodes, when a voltage applied between the first and second connection terminals of the current detection resistor increases above or decreases below a predetermined voltage, turns on to connect one of the first or second resistor, which is connected to the one of the first and second diodes, to the current detection resistor in parallel with each other, and an aspect in which further including a positive voltage source connected to the first voltage supplying terminal and a negative voltage source connected to the second voltage supplying terminal.

Further, a current detection circuit according to this invention includes an aspect in which further including: a first bias voltage supplying circuit connected to the first voltage supplying circuit; the first bias voltage supplying circuit outputs a bias voltage shifting a voltage of the first connection terminal of the current detection resistor with a first voltage; and a second bias voltage supplying circuit connected to the second voltage supplying circuit; the second bias voltage supplying circuit outputs a bias voltage shifting the voltage of the first connection terminal of the current detection resistor with a second voltage, and an aspect in which the first bias voltage supplying circuit includes: a negative voltage source outputting a third voltage which has a same absolute value but the opposite polarity to the first voltage; and a first subtracting circuit connected between the first connection terminal and the negative voltage source and outputting a fifth voltage subtracting the third voltage from the voltage of the first connection terminal; and, the second bias voltage supplying circuit includes: a positive voltage source outputting a fourth voltage which has a same absolute value but the opposite polarity to the second voltage; and a second subtracting circuit connected between the first connection terminal and the positive voltage source and outputting a sixth voltage subtracting the fourth voltage from the voltage of the first connection terminal.

Further, a saturation prevention and recovery circuit for an amplifier according to this invention includes: first and second signal terminals; first and second resistors connected in parallel with each other to the first signal terminal; a first diode including a cathode connected to another end of the first resistor which is not connected to the first signal terminal, and an anode connected to the second signal terminal; a second diode including an anode connected to another end of the second resistor which is not connected to the first signal terminal, and a cathode connected to the second signal terminal; a first voltage supplying terminal; a second voltage supplying terminal; a third resistor connected between the cathode of the first diode and the first voltage supplying terminal; and a fourth resistor connected between the anode of the second diode and the second voltage supplying terminal, and includes an aspect in which one of a first and second diode, when a voltage applied between the first and second signal terminals increases above or decreases below a predetermined voltage, turns on to connect one of the first and second resistors, which is connected to the one of the first and second diodes, between the first and second signal terminals.

BRIEF DESCRIPTION OF THE DRAWINGS

Further preferred features of the invention will now be described for the sake of example only with reference to the following figures, in which.

DETAILED DESCRIPTION

Figure 1:
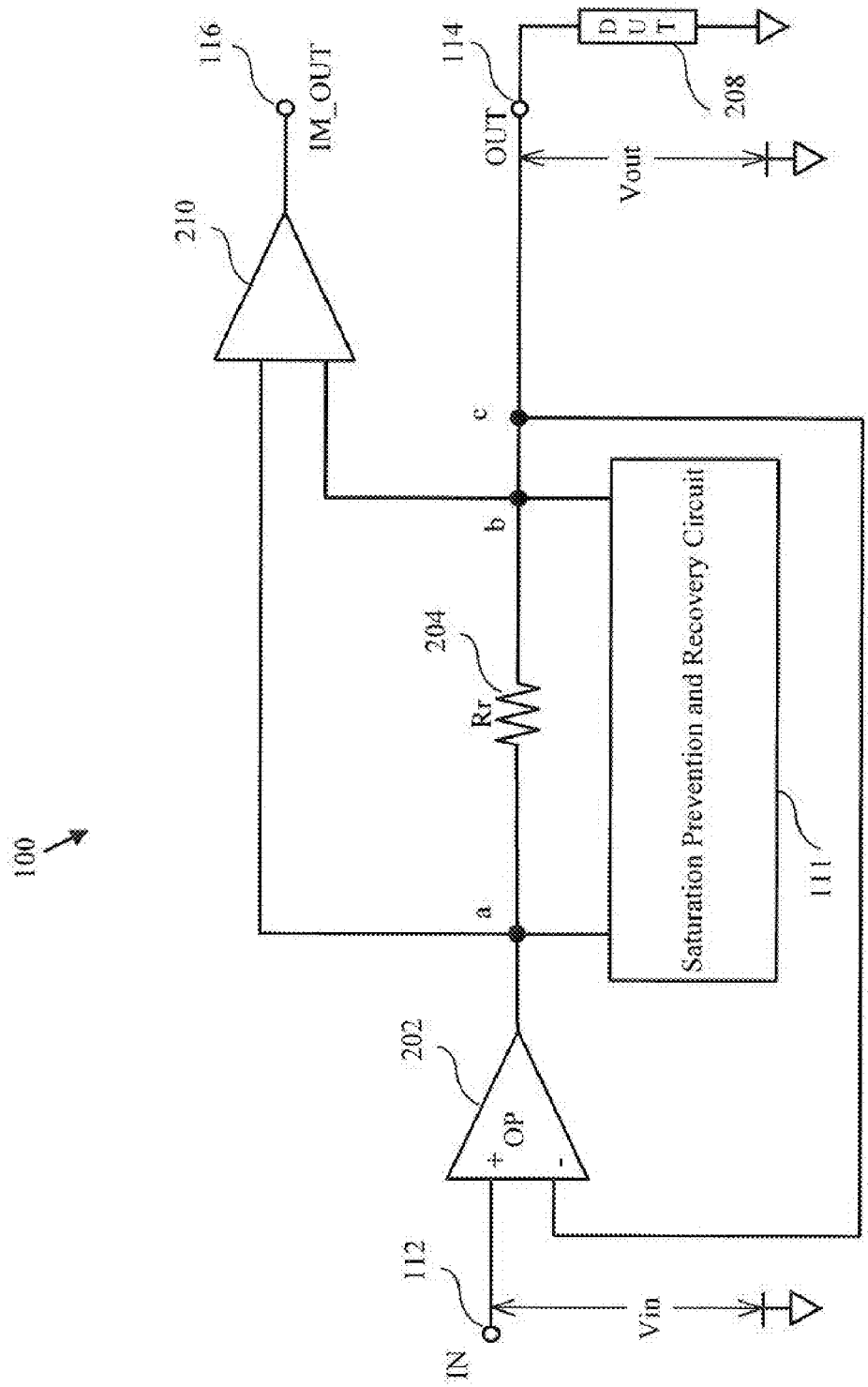
FIG. 1 is a circuit diagram of a current measurement device which is a preferred embodiment of the present invention.

FIG. 1 illustrates a current measurement circuit 100 according to an embodiment of the present invention for improving a transient response due to a sudden change in a setting voltage or a load. It should be noted that like components are denoted by like reference numerals as in FIG. 4.

An output of an operational amplifier 202 is output to an output terminal OUT (114) via a current detection resistor or a range resistor Rr (204) serially connected to the output. A load voltage Vout is fed back to an inverting input terminal of the operational amplifier 202 from a terminal c, whose electric potential is equal to that of the output terminal 114. Furthermore, a device under test DUT (208) is connected to the output terminal 114. A set voltage Vin is input to a non-inverting input terminal of the operational amplifier 202 via an input terminal IN (112). According to the above-mentioned configuration, in the current measurement circuit 100, a constant-voltage loop circuit or a constant-voltage feedback loop circuit is constructed.

To both ends of the current detection resistor Rr (204), inverting and non-inverting input terminals of a differential amplifier for current detection (210) are connected, and the differential amplifier for current detection (210) outputs a voltage, which is proportional to a current flowing through the resistor Rr (204), to a current output terminal IM_OUT (116).

Moreover, when a terminal of the resistor 204 on a side of the operational amplifier 202 is a terminal a, and the other terminal of the resistor 204 is a terminal b, a saturation prevention and recovery circuit 111 for an operational amplifier is connected between the terminals a and b in parallel with the resistor 204. On this occasion, the saturation prevention and recovery circuit 111, when the current flowing through the resistor 204 increases and, as a result, the operational amplifier 202 is being saturated or has been saturated, carries out a high-speed self-detection or a high-speed operation for detecting a state thereof in the circuit 111, and then carries out a control operation, thereby serving to prevent the saturation and/or to reduce a period for recovery from the saturation of the operational amplifier 202. On this occasion, the saturation prevention and recovery circuit 111 according to this embodiment is a circuit providing saturation prevention and saturation recovery functions based on the self-detection, which do not use a control mechanism such as a D/A converter and a processor such as a CPU for which a control time in an order of microsecond is necessary as described above as the prior art.

Figure 2:
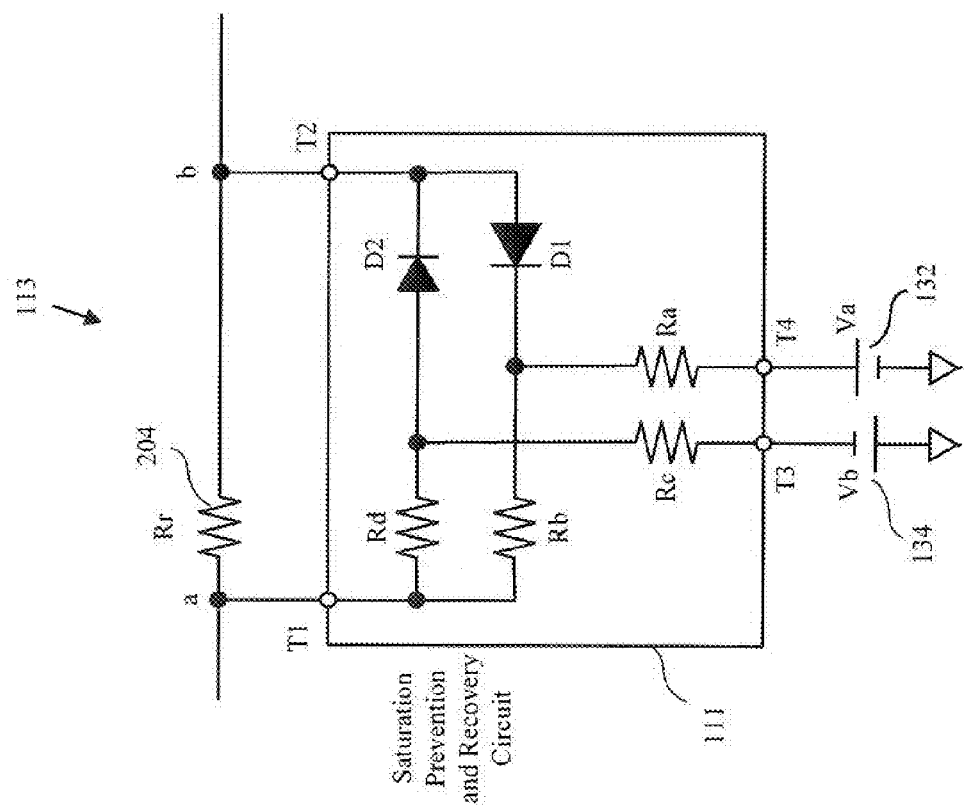
FIG. 2 is a circuit diagram detailing a part of FIGURE. 1.

Referring to FIG. 2, a detailed description is now given of the saturation prevention and recovery circuit 111 illustrated in FIG. 1 and a current detection circuit or current detection resistor circuit 113 provided with the saturation prevention and recovery circuit 111 and the current detection resistor 204. The saturation prevention and recovery circuit 111 includes terminals T1 and T2 to which the terminals a and b on the both ends of the resistor Rr (204) are connected, and further includes terminals T4 and T3 to which voltage sources 132 and 134 are respectively connected. To the terminal T1, resistors Rb and Rd are connected in parallel with each other. To a side of the resistor Rb which is not connected to the terminal T1, a cathode of a diode D1 is connected, and an anode of the diode D1 is connected to the terminal T2. To a side of the resistor Rd which is not connected to the terminal T1, an anode of a diode D2 is connected, and a cathode of the diode D2 is connected to the terminal T2. In other words, the diodes D1 and D2 are connected in directions in which polarities thereof are opposite to each other.

Between the resistor Rb and the diode D1, in order to apply a reverse bias in a steady state, a resistor Ra is connected via the terminal T4 to the voltage source 132, which is biased to a positive voltage Va. Similarly, between the resistor Rd and the diode D2, in order to apply a reverse bias in the steady state, a resistor Rc is connected via the terminal T3 to the voltage source 134, which is biased to a negative voltage Vb.

In other words, both of the diodes D1 and D2 are usually biased reversely, and hence the diodes D1 and D2 do not affect an operation of the circuit. However, when a current flowing through the DUT 208 increases or decreases, and the voltage between the both ends of the resistor 204 exceeds a predetermined voltage determined by a voltage division ratio of the relating resistors and the bias voltage, which is to be hereinafter described, the bias applied to one of the diodes switches from a reverse direction to a forward direction, and thus, this diode turns on. As a result, the resistor Rb or Rd is newly connected to the resistor 204 in parallel, whereby the total resistance decreases, and the voltage between the both ends of the resistor 204 decreases. Therefore, by properly selecting values of the bias voltages and resistances, it is possible to prevent the operational amplifier 202 from being saturated.

Figure 3:
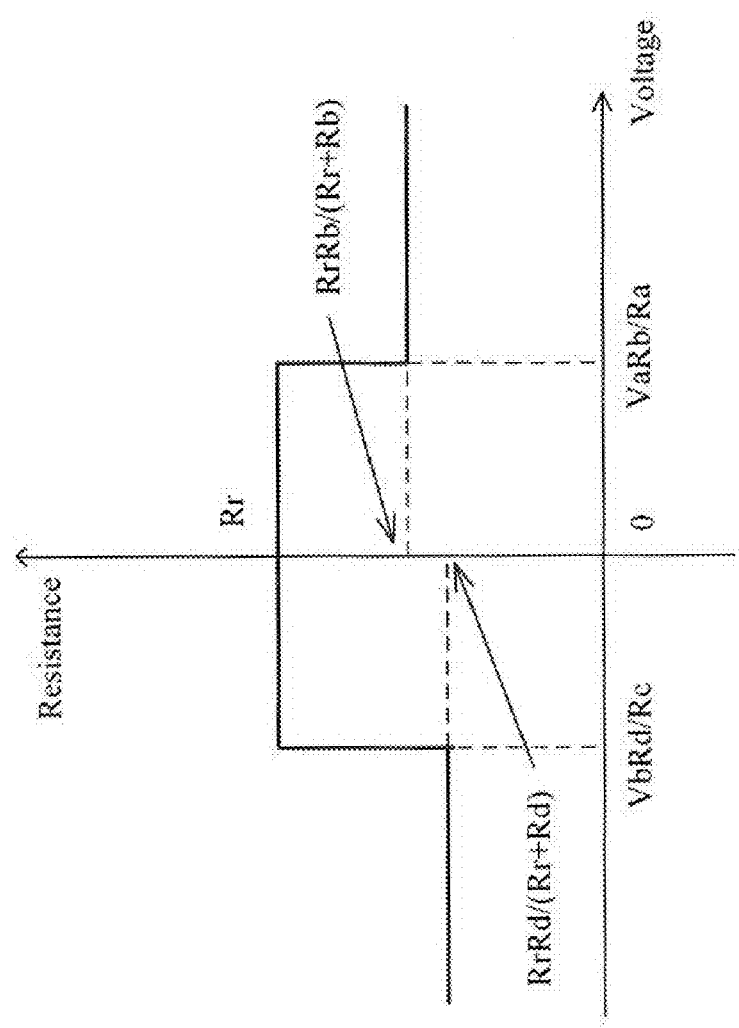
FIG. 3 is a chart illustrating circuit characteristics employing a saturation prevention and recovery circuit according to the present invention.

FIG. 3 illustrates operations of the resistor Rr (204) and the saturation prevention and recovery circuit 111 configured as described above. X axis in FIG. 3 is the voltage between both ends of the resistor Rr (204), that is, the voltage between the terminals T1-T2. When the voltage between the terminals T1-T2 is from 0 to the predetermined voltage, Va*Rb/Ra, the resistance is Rr, and when the voltage increases above Va*Rb/Ra, the resistance becomes Rr*Rb/(Rr+Rb), which is brought about by the parallel connection of the resistors Rr and Rb. Conversely, when the voltage is from 0 to a negative voltage of Vb*Rd/Rc, the resistance is Rr, and when the voltage decreases below the another predetermined voltage, Vb*Rd/Rc, the resistance becomes Rr*Rd/(Rr+Rd), which is brought about by the parallel connection of the resistors Rr and Rd. Moreover, it is apparent that, with the above-mentioned configuration, when the voltage between the terminals T1-T2 transitions to the opposite direction, and decreases below Va*Rb/Ra or increases above Vb*Rd/Rc, the parallel connection is disengaged at high speed. It should be noted that, according to necessity, the resistances may be selected such that Rb=Rd.

As described above, the saturation prevention and recovery circuit 111 and the current detection circuit 113 detect the state and carry out the control operation using the diodes and the resistors, and hence the saturation prevention and recovery circuit 111 and the current detection circuit 113 provide an advantage that the time required for the control operation is extremely short compared with the response time of the operational amplifier, and is negligible. As a result, those circuits can be significantly efficiently used for the prevention of and recovery from the saturation of the operational amplifier constituting the constant-voltage loop.

Thus, when the saturation prevention and recovery circuit 111 and the current detection circuit 113 monitor the voltage applied to the resistor 204 and detect that the operational amplifier 202 is being saturated or has been saturated based on the voltage, the saturation prevention and recovery circuit 111 and the current detection circuit 113 immediately operate so as to reduce the combined resistance. As a result, the current measurement circuit 100 can prevent the operational amplifier from being saturated, or can reduce the time until the recovery even when the operational amplifier has been saturated.

Figure 6:
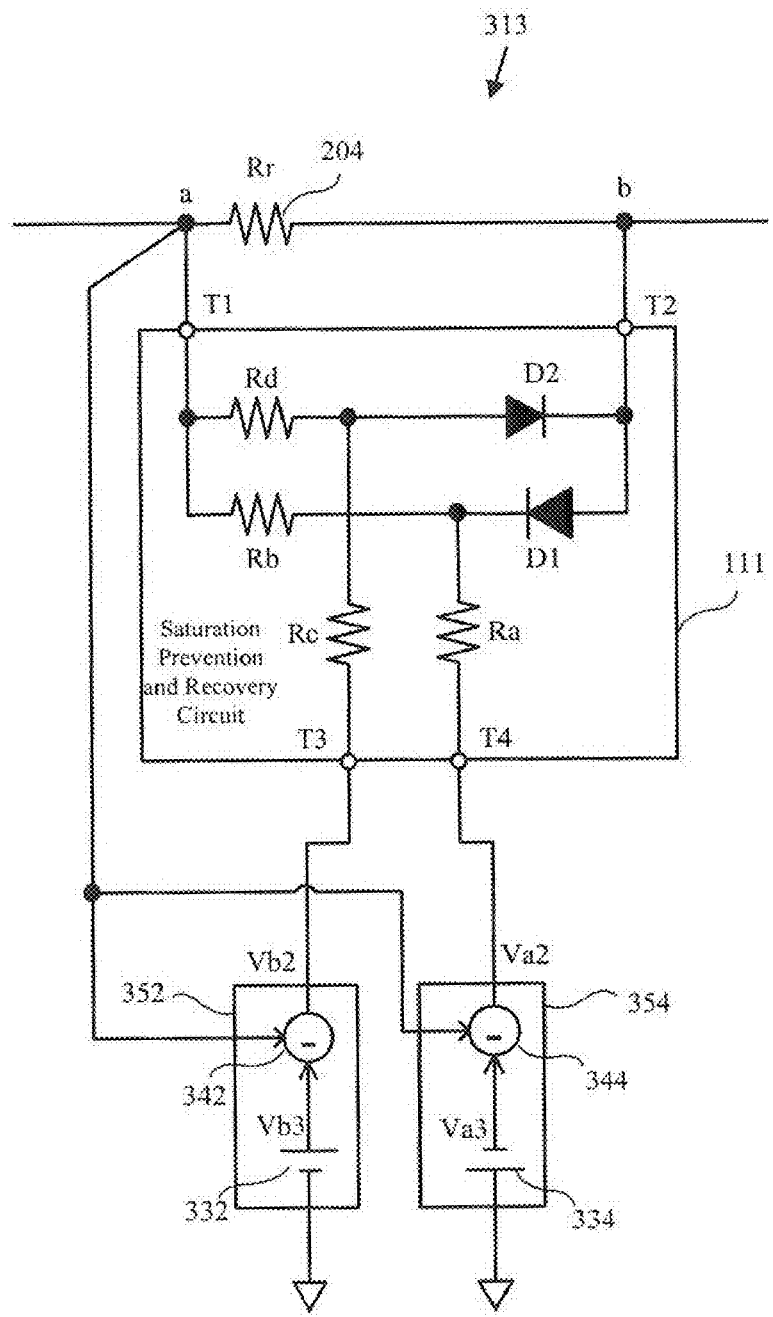
FIG. 6 shows a circuit diagram illustrating another embodiment of the present invention in FIG. 2.

FIG. 6 illustrates a current detection circuit or current detection resistor circuit 313 which is another embodiment of the current detection circuit or current detection resistor circuit 113 illustrated in FIG. 2. It should be noted that like components are denoted by like reference numerals as in FIG. 2.

In the current detection circuit 313 in FIG. 6, the saturation prevention and recovery circuit 111, having terminals T1 and T2, is connected to the terminals a and b on the both ends of the resistor Rr (204) via the terminals T1 and T2, respectively. It should be noted that the structure and operation of the saturation prevention and recovery circuit 111 are described above, and thus it is omitted here. In addition, bias voltage supplying circuits 352 and 354 are connected to terminals T3 and T4 of the saturation prevention and recovery circuit 111, respectively, so that bias voltages are supplied to resistors Rc and Ra, respectively.

Moreover, the bias voltage supplying circuits 352 and 354 are both connected to the terminal a. According to the above connections, each of bias voltage supplying circuits 352 and 354 outputs bias voltage which is shifted each predetermined voltage value from the voltage at the terminal a, and supplies the voltage to the respective connected terminals T3 and T4.

As described above, the current detection circuit 313 has the following effect. That is, in the current detection circuit 113 in FIG. 2, if the voltage Vout applied to DUT 208 in FIG. 1 is changed, the voltage at the terminal a of the current detection resistor Rr (204) is also changed. Accordingly, the turn-on voltage conditions of the diodes D1 and D2 based on the voltage at the terminal a is changed, since the voltages output from voltage sources 132 and 134 for supplying bias voltages to the diodes D1 and D2 are fixed voltages based on the ground potential. Thus, in the current detection circuit 313 in FIG. 6, with respect to the diode D2, it is configured that the bias voltage supplying circuits 352 outputs a voltage which is shifted a predetermined absolute voltage value to the negative direction from the voltage at the terminal a, and applies the voltage to the resistor Rc so as to supply the bias voltage to the diode D2. Therefore, the turn-on voltage conditions of the diode D2 based on the voltage at the terminal a will not be changed, when the voltage at the terminal a is changed. In addition, with respect to the diode D1, it is configured that the bias voltage supplying circuits 354 outputs a voltage which is shifted a predetermined absolute voltage value to the positive direction from the voltage at the terminal a, and applies the voltage to the resistor Ra so as to supply the bias voltage to the diode D1. Therefore, the turn-on voltage conditions of the diode D1 based on the voltage at the terminal a is not changed, when the voltage at the terminal a is changed. Accordingly, the current detection circuit 313 in FIG. 6 can reduce the affection of the voltage variation at the terminal a.

The bias voltage supplying circuit 352 provides a subtracting circuit 342 which is connected from a positive voltage source 332, which generates a positive voltage Vb3, and the terminal a as inputs and connected to the terminal T3 as an output. The subtracting circuit 342 subtracts the positive voltage Vb3 from the voltage at the terminal a and outputs the result voltage to the terminal T3. In addition, the bias voltage supplying circuit 354 provides a subtracting circuit 344 which is connected from a negative voltage source 334, which generates a negative voltage Va3, and the terminal a as inputs and connected to the terminal T4 as an output. The subtracting circuit 344 subtracts the negative voltage Va3 from the voltage at the terminal a, in other words, adds the absolute voltage value of the negative voltage Va3 to the voltage at the terminal a, and outputs the result voltage to the terminal T4.

Figure 7:
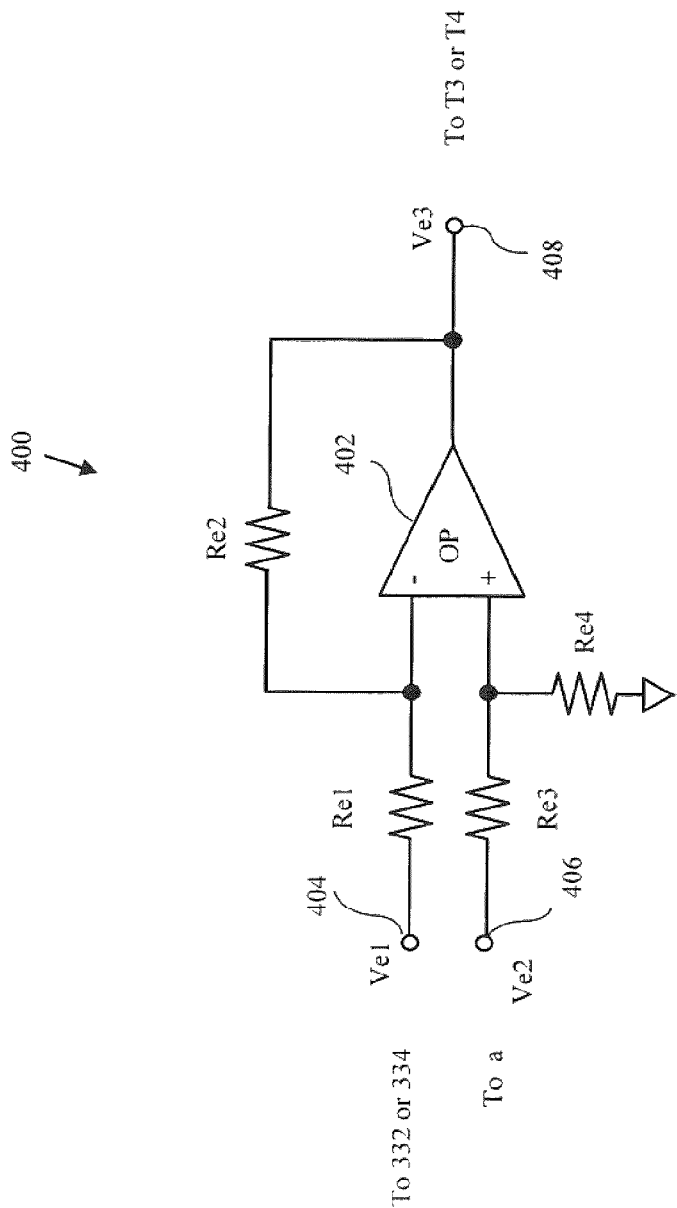
FIG. 7 illustrates a circuit diagram detailing a part of FIG. 6.

Moreover, with respect to the subtracting circuit 342 and 344, for example, a subtracting circuit 400 illustrated in FIG. 7 can be used. The subtracting circuit 400 is a subtracting circuit using an operational amplifier 402 whereas the input terminal 406, which is connected to a non-inverting input of the operational amplifier 402 via a resistor Re3, is connected to the terminal a, the input terminal 404, which is connected to an inverting input of the operational amplifier 402 via a resistor Re1, is connected to the voltage source 332 or 334, and the output terminal 408 of the subtracting circuit 400, which is connecter to the output of the operational amplifier 402, is connected to terminal T3 or T4. In addition, a resistor Re2 is connected between the output of the operational amplifier 402 and the inverting input of the operational amplifier 402. Supposing that the input voltage to the input terminal 404 is Ve1, the input voltage to the input terminal 406 is Ve2, and the output voltage of the output terminal 408 is Ve3, the voltage Ve3 is given as follows:

$$Ve3=(Re1+Re2)*Re4*Ve2/(Re1*(Re3+Re4))-Re2*Ve1/R1.$$

It should be noted that when all the resistance values of resistors Re1, Re2, Re3 and Re4 are equal, the output voltage Ve3 is given by Ve3=Ve2−Ve1.

Figure 4:
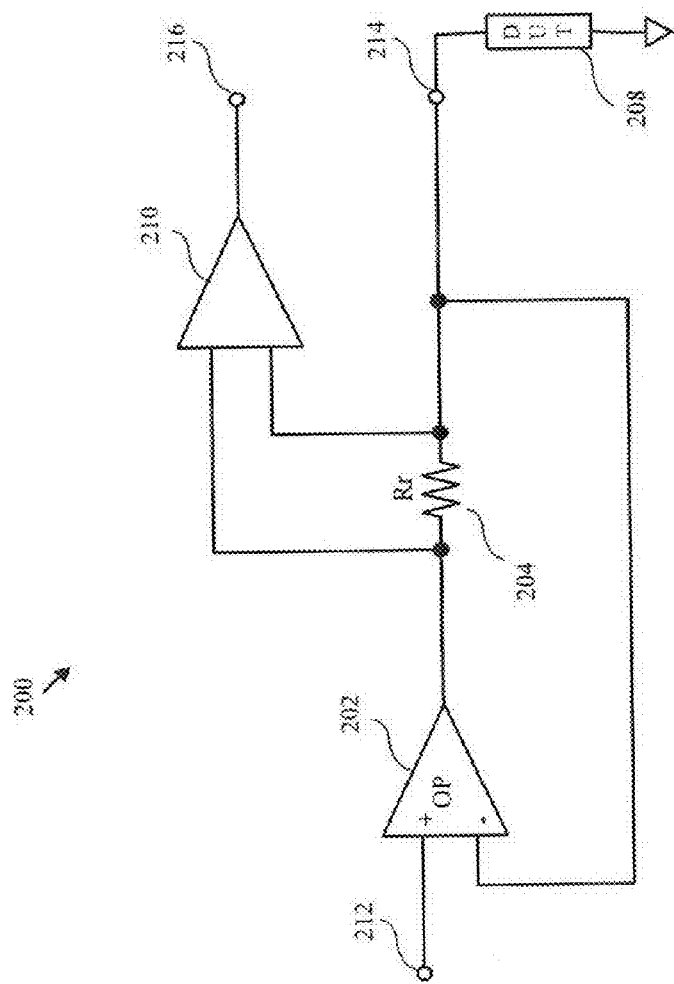
FIG. 4 shows a circuit diagram of a current measurement device according to a prior art.
Figure 5:
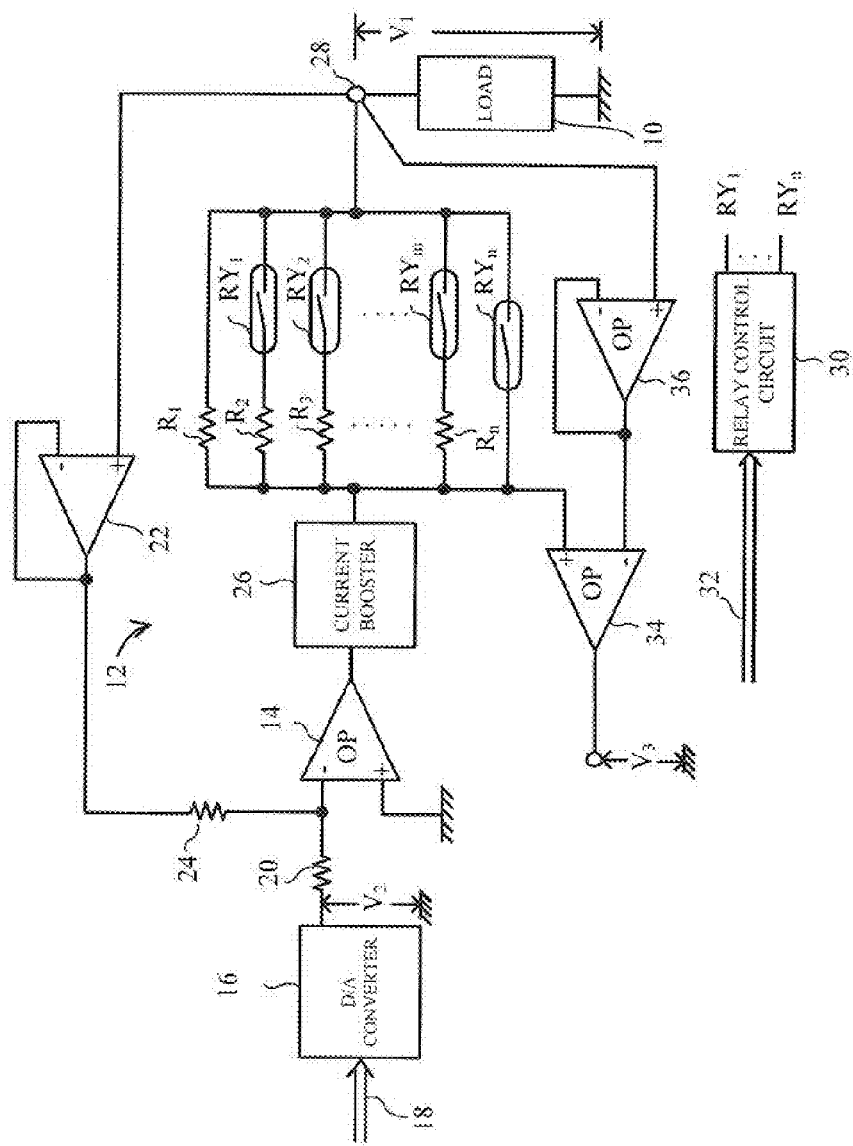
FIG. 5 shows a circuit diagram of another current measurement device according to another prior art.

The description has been given for the embodiments, and, based on the thought of the invention, it is possible to apply various modifications and changes. For example, the current detection resistor according to this embodiment may be constructed by a plurality of resistors for ranging. Moreover, though this embodiment has been described while the non-inverting amplifier circuit illustrated in FIG. 4 is taken as an example, this embodiment may be applied to an inverting amplifier circuit as illustrated in FIG. 5. Furthermore, in relation to the detailed circuit of the bias voltage supplying circuit 352 or 354 illustrated in FIG. 6, various circuits, such as an inverting adding circuit, can be used for realizing the bias voltage supplying circuit instead of the subtracting circuit.

The invention claimed is:

1. A current measurement circuit, comprising:
    a constant-voltage loop circuit comprising an operational amplifier, and a current detection resistor connected to an output of the operational amplifier, the output of the operational amplifier being fed back to an inverting input terminal of the operational amplifier via the current detection resistor;
    a differential amplifier for current detection with an input of a voltage between both ends of the current detection resistor; and
    a saturation prevention and recovery circuit connected to the both ends of the current detection resistor for preventing saturation of the operational amplifier and/or accelerating recovery from the saturation thereof.

2. A current measurement circuit according to claim 1, wherein the saturation prevention and recovery circuit comprises:
    first and second connection terminals connected to the both ends of the current detection resistor;
    a first shunt circuit comprising a first resistor and a first diode, which are serially connected, the first shunt circuit being connected between the first and second connection terminals in parallel with the current detection resistor;

a second shunt circuit comprising a second resistor and a second diode, which are serially connected, the second shunt circuit being connected between the first and second connection terminals in parallel with the current detection resistor and the polarity of the second diode being connected oppositely to that of the first diode;

a first bias circuit connected to a connection point between the first resistor and the first diode, in a steady state, reversely biasing the first diode; and a second bias circuit connected to a connection point between the second resistor and the second diode, in a steady state, reversely biasing the second diode.

3. A current measurement circuit according to claim 2, wherein one of the first and second diodes, when the voltage applied to the both ends of the current detection resistor increases above or decreases below a predetermined voltage, turns on to connect one of the first and second resistors, which is connected to the diode, to the current detection resistor in parallel with each other, thereby preventing the saturation of the operational amplifier and/or accelerating the recovery from the saturation thereof.

4. A current detection circuit, comprising:
a current detection resistor provided a first and a second connection terminals; the first connection terminal of the current detection resistor being connected to an output of an operational amplifier;
first and second resistors connected in parallel with each other to the first connection terminal of the current detection resistor;
a first diode including a cathode connected to another end of the first resistor which is not connected to the first connection terminal of the current detection resistor, and an anode connected to the second connection terminal of the current detection resistor;
a second diode including an anode connected to another end of the second resistor which is not connected to the first connection terminal of the current detection resistor, and a cathode connected to the second connection terminal of the current detection resistor;
a first voltage supplying terminal;
a second voltage supplying terminal;
a third resistor connected between the cathode of the first diode and the first voltage supplying terminal; and
a fourth resistor connected between the anode of the second diode and the second voltage supplying terminal.

5. A current detection circuit according to claim 4, wherein one of the first and second diodes, when a voltage applied between the first and second connection terminals of the current detection resistor increases above or decreases below a predetermined voltage, turns on to connect one of the first or second resistor, which is connected to the one of the first and second diodes, to the current detection resistor in parallel with each other.

6. A current detection circuit according to claim 4, further comprising a positive voltage source connected to the first voltage supplying terminal and a negative voltage source connected to the second voltage supplying terminal.

7. A current detection circuit according to claim 4, further comprising:
a first bias voltage supplying circuit connected to the first voltage supplying circuit; the first bias voltage supplying circuit outputs a bias voltage shifting a voltage of the first connection terminal of the current detection resistor with a first voltage; and
a second bias voltage supplying circuit connected to the second voltage supplying circuit; the second bias voltage supplying circuit outputs a bias voltage shifting the voltage of the first connection terminal of the current detection resistor with a second voltage.

8. A current detection circuit according to claim 7, wherein the first bias voltage supplying circuit comprises:
a negative voltage source outputting a third voltage which has a same absolute value but the opposite polarity to the first voltage; and
a first subtracting circuit connected between the first connection terminal and the negative voltage source and outputting a fifth voltage subtracting the third voltage from the voltage of the first connection terminal; and,
wherein the second bias voltage supplying circuit comprises:
a positive voltage source outputting a fourth voltage which has a same absolute value but the opposite polarity to the second voltage; and
a second subtracting circuit connected between the first connection terminal and the positive voltage source and outputting a sixth voltage subtracting the fourth voltage from the voltage of the first connection terminal.

9. A saturation prevention and recovery circuit for an operational amplifier, comprising:
first and second signal terminals;
first and second resistors connected in parallel with each other to the first signal terminal;
a first diode including a cathode connected to another end of the first resistor which is not connected to the first signal terminal, and an anode connected to the second signal terminal;
a second diode including an anode connected to another end of the second resistor which is not connected to the first signal terminal, and a cathode connected to the second signal terminal;
a first voltage supplying terminal;
a second voltage supplying terminal;
a third resistor connected between the cathode of the first diode and the first voltage supplying terminal; and
a fourth resistor connected between the anode of the second diode and the second voltage supplying terminal.

10. A saturation prevention and recovery circuit for an operational amplifier according to claim 9, wherein one of a first and second diode, when a voltage applied between the first and second signal terminals increases above or decreases below a predetermined voltage, turns on to connect one of the first and second resistors, which is connected to the one of the first and second diodes, between the first and second signal terminals.

* * * * *